United States Patent [19]

Wakamiya et al.

[11] Patent Number: 4,785,671
[45] Date of Patent: Nov. 22, 1988

[54] STRESS-SENSITIVE SENSORS UTILIZING AMORPHOUS MAGNETIC ALLOYS

[75] Inventors: Masayuki Wakamiya, Osaka; Ichiro Yamashita, Kyoto; Hiroyuki Hase; Yukihiko Ise, both of Osaka, all of Japan

[73] Assignee: Matsushita Electric Industrial Co., Ltd., Osaka, Japan

[21] Appl. No.: 103,743

[22] Filed: Oct. 2, 1987

Related U.S. Application Data

[63] Continuation of Ser. No. 925,476, Oct. 3, 1986, abandoned, which is a continuation of Ser. No. 711,014, Mar. 12, 1985, abandoned.

[30] Foreign Application Priority Data

Mar. 13, 1984 [JP] Japan .................................. 59-48915

[51] Int. Cl.$^4$ .................................................. G01B 7/24
[52] U.S. Cl. ........................................ 73/779; 73/728; 73/862.36; 73/DIG. 2
[58] Field of Search ...................... 73/779, 728, 862.36, 73/862.69, DIG. 2; 324/209

[56] References Cited

U.S. PATENT DOCUMENTS

| | | | |
|---|---|---|---|
| 2,053,560 | 9/1936 | Janovsky | 73/862.69 |
| 4,412,454 | 11/1983 | Yamashita et al. | 73/728 |
| 4,414,855 | 11/1983 | Iwasaki | 73/DIG. 2 |
| 4,434,671 | 3/1984 | Yamashita etal. | 73/DIG. 2 |

OTHER PUBLICATIONS

"Oil Pressure Sensor Using Iron-Base Amorphous Magnetic Alloy", Proceedings of the 3rd Symposium, 1983, pp. 219-222, Ichiro Yamashita et al (referred to in our specification at p. 11, lines 16-18).

Primary Examiner—Charles A. Ruehl
Attorney, Agent, or Firm—Lowe, Price, LeBlanc, Becker & Shur

[57] ABSTRACT

A stress-sensitive sensor comprising a means for generating magnetic flux, a thin sheet of an amorphous magnetic alloy which is located in the magnetic flux and which is physically deformed in response to an external force to be measured, and a means for detecting the physical deformation as a variation of the magnetic flux which depends on the external force. The amorphous magnetic alloy consists essentially of $Fe_aCr_bSi_cB_d$, in which a is a value of from 69 to 81.5 atomic percent, b is a value of from 2.5 to 6 atomic percent, c is a value of from 10 to 15 atomic percent, and d is a value from 6 to 10 atomic percent provided that $a+b+c+d=100$. The sensor is particularly suitable for oil pressure or torque detection.

16 Claims, 7 Drawing Sheets

STRESS-SENSITIVE SENSORS UTILIZING AMORPHOUS MAGNETIC ALLOYS

This application is a continuation of abandoned U.S. application Ser. No. 925,476 filed on Oct. 3, 1986 of the same title, which in turn is a continuation application of abandoned U.S. application Ser. No. 06-711,014 filed on Mar. 12, 1985 of the same title by the same inventors.

BACKGROUND OF THE INVENTION

1. Field of the Invention

This invention relates to the use of amorphous magnetic alloys having high magnetostrictive effects and more particularly, to stress-sensitive sensors, such as oil pressure and torque sensors, which make use of the alloys and can stand use under severe conditions of high stress or in a condition full of oil or oil mist.

2. Description of the Prior Art

A variety of amorphous alloys have been produced by rapid quenching methods, among which iron-base amorphous alloys are considered to have wide utility as magnetic materials because of the high saturation magnetic flux density and the great magnetostrictive effect. For instance, attempts have been made to apply the alloys as cores for transformers, and as diaphragms of magnetostrictive sensors such as pressure sensors. One of the applications which have now been reduced to practice, is an oil pressure sensor for detecting high oil pressure in systems. In this sensor, an amorphous magnetic alloy in the form of a diaphragm, which is placed in magnetic field, is distorted or strained by application of oil pressure. This distortion causes permeability of the diaphragm to vary. This variation of the permeability is detected by a suitable means as a variation of magnetic flux or inductance, followed by conversion into an oil pressure. Thus, the applied pressure can be measured. The amorphous magnetic alloys used for these purposes are employed under so severe conditions that they are brought into direct contact with oil and suffer high pressure. In this sense, the alloys should be soft magnetic materials which have high mechanical strength, good resistance to corrosion, and large saturation magnetostriction. Fe-Si-B alloys are known as soft magnetic materials which have high mechanical strength and large saturation magnetostriction. For example, alloys having compositions of $Fe_{78}Si_{10}B_{12}$ and $Fe_{60-90}Si_{0.1-15}B_{10-30}$ have been proposed, as pressure sensors, in Japanese Laid-open application No. 49-91014. However, when applied as an oil pressure sensor, the alloys tend to be highly oxidized because oxygen gas, water, and oxides in oils come into contact with the alloys under high pressure. This results in lowerings of mechanical strength and magnetic characteristics, which will bring about breakage of the sensor or at least deteriorate the sensor with time.

Another problem involved in the sensor using the Fe-Si-B alloys is that expensive boron is contained in an amount as great as 10 to 30 atomic percent, and thus the cost of the sensor itself becomes very high, thus permitting only a limited use. In order to apply amorphous magnetic alloys as oil pressure or other sensors, it is believed essential to use inexpensive amorphous alloys having good corrosion resistance.

In order to improve the corrosion resistance, it may be effective to substitute part of iron in the alloys with nickel or chromium. However, when nickel or chromium is added to the alloys, the saturation magnetostriction lowers considerably and thus the alloy is not suited for a sensor because of the reduction of the magnetostrictive effect of the alloy.

For the manufacture of amorphous magnetic alloys at low costs, it is convenient to lower the concentration of the most expensive boron in the alloy compositions. However, when the concentration of boron is smaller than 10 atomic percent, the degree of amorphousness attained by the rapid quenching method lowers, so that there cannot be obtained a ribbon or thin sheet of an amorphous alloy having good quality and high mechanical strength. Thus, this ribbon is also not suitable as a sensor material.

The known amorphous magnetic alloys have been discussed with reference to oil pressure sensors, which discussion is true of torque sensors. In automobiles, torque sensors are ordinarily installed at the inside of or near a transmission, which is usually full of oil or oil mist. When instantaneous torque is applied to an amorphous magnetic alloy ribbon, a shear stress of 30 to 40 kg/mm² is produced. Accordingly, it has been highly demanded to develop amorphous soft magnetic alloys which have good mechanical strength, corrosion resistance and magnetostrictive effect and which are inexpensive.

SUMMARY OF THE INVENTION

It is accordingly an object of the present invention to provide stress-sensitive sensors using amorphous magnetic alloys which have good mechanical strength, good corrosion resistance, and high magnetostrictive effects, and which are inexpensive.

It is another object of the invention to provide stress-sensitive sensors such as oil pressure sensors, torque sensors, and the like, which can stand use under severe environmental conditions.

The present invention provides a stress-sensitive sensor which has a construction comprising a means for generating magnetic flux, a thin sheet of an amorphous magnetic alloy which is located in the magnetic flux and which is physically deformed in response to an external force to be measured, and a means for detecting the physical deformation as a variation of the magnetic flux which depends on the external force. The amorphous magnetic alloy used in the sensor consists essentially of a composition of $Fe_aCr_bSi_cB_d$, in which a is a value of 69 to 81.5 atomic percent, b is a value of 2.5 to 6 atomic percent, c is a value of 10 to 15 atomic percent, and d is a value of 6 to 10 atomic percent provided that $a+b+c+d=100$.

The external force suitably measured by the sensor may be oil pressure or torque exerted on the ribbon or thin sheet. The ribbon should preferably have a thickness of from 25 μm to 40 μm for reasons described hereinafter.

If the sensor is an oil sensor, the alloy is used in the form of a diaphragm, which is located in magnetic flux to from a magnetic circuit with a ferromagnetic core, and is arranged to be physically deformed in response to an oil presure exerted on the diaphragm on one side thereof. When external force is applied to the diaphragm, internal stress or strain is produced in the diaphragm, so that the permeability of the alloy diaphragm decreases through the magnetostrictive effect of the alloy, with a decrease of the magnetic flux or inductance. If this variation is detected by a suitable means connected in association with the magnetic circuit, the external force exerted on the diaphragm can be readily calculated based on the variation. Torque may be also detected by a torque sensor using the alloy defined above.

DETAILED DESCRIPTION AND PREFERRED EMBODIMENTS OF THE INVENTION

The alloys used in the invention are first described. In order to produce inexpensive alloys, it is necessary to reduce the concentration of boron. Iron-base amorphous magnetic alloys comprising below 10 atomic percent of boron have been studied. A number of amorphous magnetic alloys represented by the formula, $(Fe_{0.95}Cr_{0.05})_{77.5+X}Si_{12.5}B_{10-X}$, are made according to a rapid quenching method. Amorphous alloys of good quality can be obtained when $X \leq 4$. When $X > 4$, crystallization takes place in part or the whole of a ribbon. Thus, mechanical strength lowers considerably with magnetic characteristics varying greatly. In an extreme case, no ribbon can be formed. In the above composition, amorphous alloys of good quality are obtained when the concentration of boron is in the range of from 10 to 6 atomic percent.

Next, amorphous alloys of the formula, $(Fe_{0.95}Cr_{0.05})_{91.5-y}Si_yB_{8.5}$, are made using the rapid quenching method. As a result, it is found that when $y < 10$, amorphous alloy ribbons which have partially crystallized portions are obtained, with a considerable lowering of mechanical strength. On the other hand, when $y > 15$, it is difficult to obtain amorphous alloys. In the range where $10 \leq y \leq 15$, amorphous alloy ribbons, which have high toughness and good quality, are obtained.

Moreover, amorphous alloys of the formula, $Fe_{79-z}Cr_zSi_{12.5}B_{8.5}$ in which the concentrations of Si and B are maintained at 12.5 atomic percent and 8.5 atomic percent, respectively, are made. As the amount of Cr increases, magnetic charcteristics lower. However, when $0 \leq z \leq 10$, the alloy ribbons of good quality are obtained.

Figure 1:
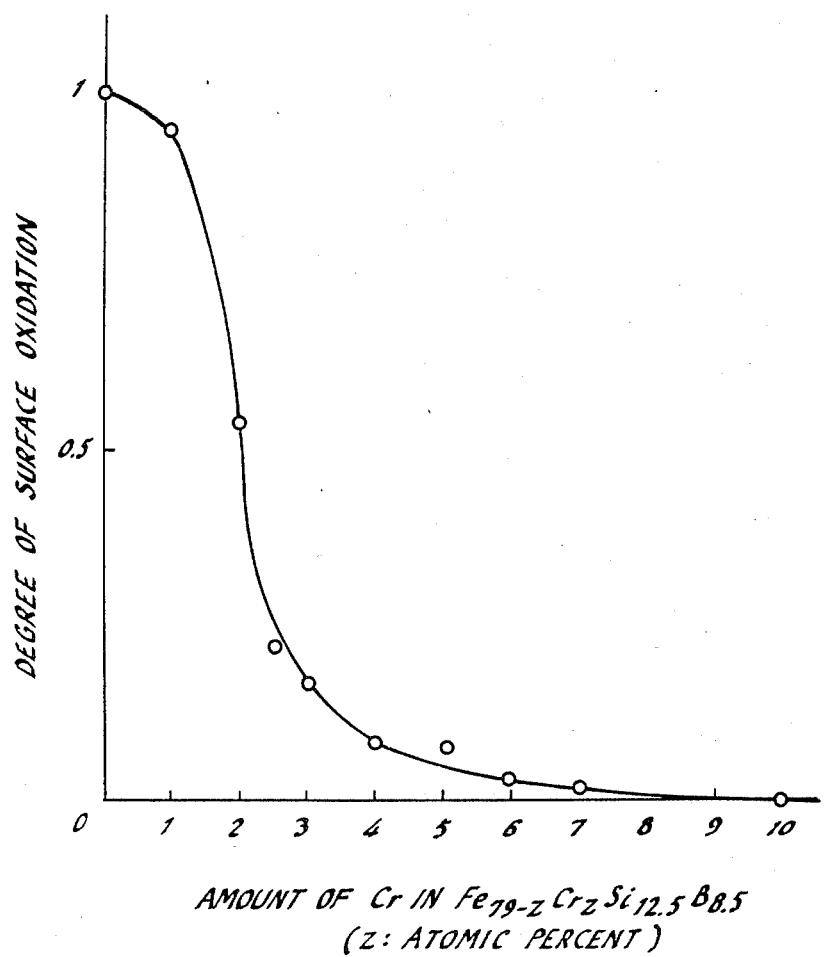
FIG. 1 is a graph showing the relation between amount of Cr in an amorphous magnetic alloy ribbon of $Fe_{79-z}Cr_zSi_{12.5}B_{8.5}$ and a degree of surface oxidation determined according to a salt spray test.
Figure 2:
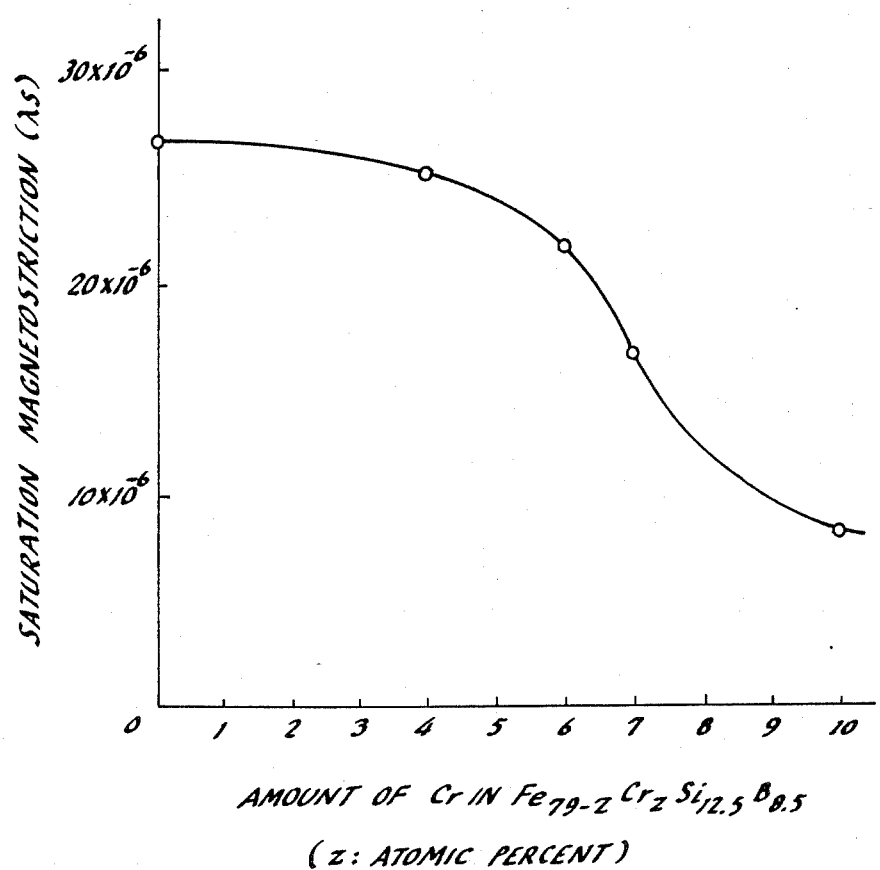
FIG. 2 is a graph showing the relation between saturation magnetostriction and amount of Cr in an amorphous magnetic alloy ribbon of $Fe_{79-z}Cr_zSi_{12.5}B_{8.5}$.

These ribbon samples are subjected to a salt spraying test in which an aqueous NaCl solution is sprayed over each sample at 35° C. for 2 hours and the sample surface is visually observed to determine a proportion of a corroded area to the total surface area tested. This proportion is used to judge a corrosion resistance or degree of oxidation. The results are shown in FIG. 1, from which it will be seen that when $z \geq 2.5$, the resulting amorphous alloys suffer little corrosion and are highly resistant to corrosion. However, when $Z > 6$, the alloys exhibit a sharply decreased saturation magnetostriction characteristic as is particularly shown in FIG. 2, and are thus unsuitable for use as sensors which make use of the magnetostrictive effect of the alloys. From the above, the amount of Cr in the alloys is in the range of $2.5 \leq Z \leq 6$ where the corrosion resistance is improved and the saturation magnetic characteristic is good.

The concentration of iron in the alloys of the invention is automatically determined in view of the ranges in concentration of Cr, Si, and B.

The alloys of $Fe_{81.5}Cr_{2.5}Si_{10}B_6$ which have minimum atomic percent values of Cr, Si and B within the above-defined ranges and $Fe_{69}Cr_6Si_{15}B_{10}$ which have, on the other hand, maximum values of Cr, Si and B can yield ribbons of good quality.

The amorphous alloys as defined above have a tensile strength of 150 kg/mm$^2$ or higher. In particular, the amorphous alloy of $Fe_{75}Cr_4Si_{12.5}B_{8.5}$ has a tensile strength over 300 Kg/mm$^2$. Moreover, the alloys of the invention have an effective permeability (1 mOe, 1 KHz) of 3000 or higher. With the amorphous alloy of $Fe_{75}Cr_4Si_{12.5}B_{8.5}$, the permeability is as high as about 8000. It will be noted that the permeability is determined after thermal treatment at a temperature between crystallization temperature, Tx, and Curie temperature, Tc, e.g. the amorphous alloy of $Fe_{75}Cr_4Si_{12.5}B_{8.5}$ has Tx=465° C. and Tc=319°. Thus, the alloys of the invention are good soft magnetic materials.

The alloys of the invention, which has the formula of $Fe_{69-81.5}Cr_{2.5-6}Si_{10-15}B_{6-10}$, are readily formed into an amorphous alloy ribbon according to the so-called rapid quenching method. The ribbon has good corrosion resistance, large saturation magnetostriction, and high mechanical strength, and are adapted for use as oil pressure or torque sensors.

Figure 3:
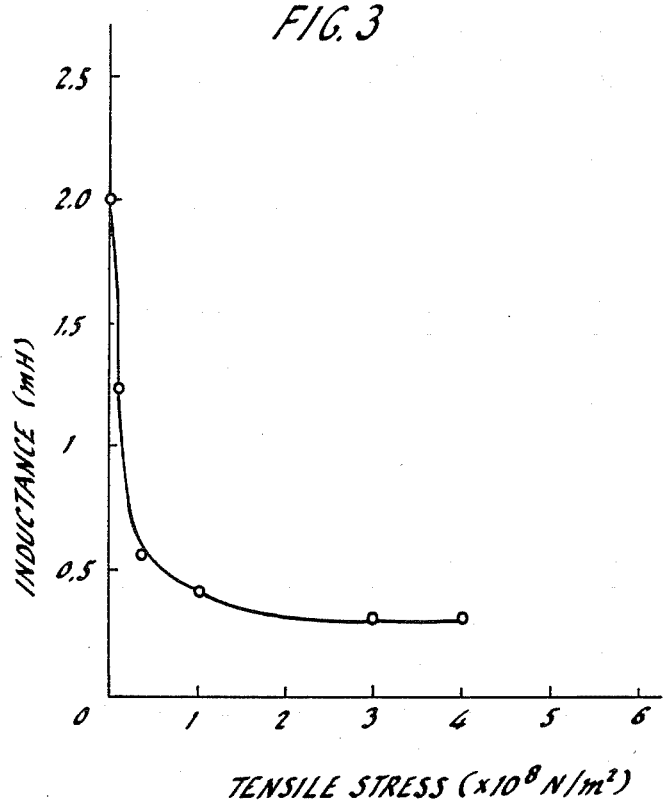
FIG. 3 is a graph showing the relation between inductance and tensile stress of the alloy.

The principle of a magnetostrictive sensor using the alloy of the invention is described with reference to FIG. 3. For instance, a ribbon of the amorphous alloy of $Fe_{75}Cr_4Si_{12.5}B_{8.5}$ exhibits an inductance value which varies greatly depending on the stress, e.g. tensile stress, exerted on the ribbon as particularly shown in FIG. 3. Thus, the alloy has the great magnetostrictive effect.

Figure 4:
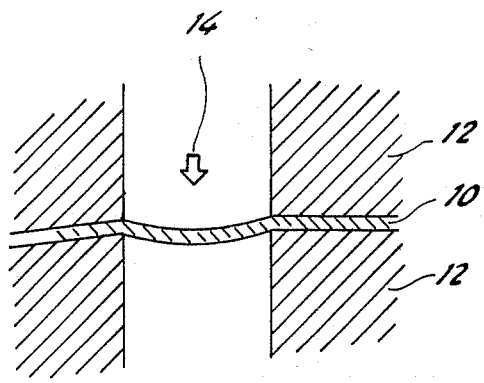
FIG. 4 is a schematic sectional view of a strained or distorted ribbon of an amorphous magnetic alloy.

The principle of detecting, for example, an oil pressure by the use of the magnetostrictive effect is particularly shown in FIG. 4. In the figure, an amorphous alloy ribbon 10 is fixed to a support 12 in association with a suitable means (not shown) to form a magnetic circuit. When an oil pressue is applied in the direction of arrow 14, the ribbon 10 is distorted as shown. When magnetic flux is applied to the ribbon, permeability of the ribbon varies through the magnetostrictive effect of the alloy. As the permeability varies, the magnetic flux or inductance varies. In short, the magnetic flux varies in response to a variation of the distortion. This variation of the magnetic flux is measured, from which the oil pressure applied is calculated and detected.

Stress-sensitive sensors using the alloy of the invention are more particularly described with reference to FIGS. 5, 6 and 7.

Figure 5:
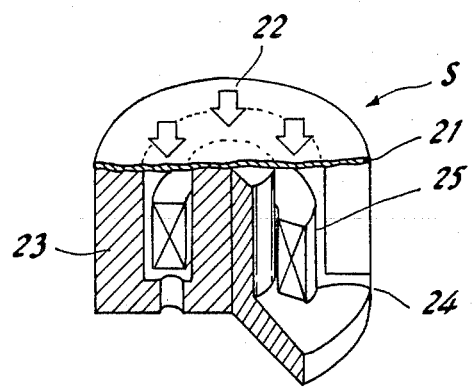
FIG. 5 is a perspective view, partially in section, of an oil pressure sensor using a diaphragm of an amorphous magnetic alloy of the invention.
Figure 6:
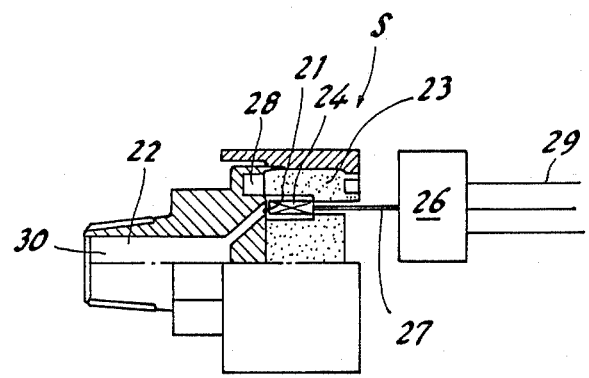
FIG. 6 is a view, partially in section, of the sensor of FIG. 5 installed in an oil pressure sensor system.

In FIGS. 5 and 6, there is shown an oil pressure sensor S which has an amorphous magnetic alloy diaphragm 21 to which an oil 22 is applied to one side of the diaphragm 21 under pressure. The diaphragm 21 is placed on a ferromagnetic core 23 such as ferrite so that a magnetic circuit is constituted. The ferrite core 23 has, in a groove 25 thereof, a coil 24 for detecting an magnetic flux or inductance of the magnetic circuit through a detector circuit 26, which has also the function of energizing the coil 24 in this case. Of course, a coil energizing circuit may be separately provided. The circuit 26 may be a circuit as particularly described in "Oil Pressure Sensor Using Iron-base Amorphous Magnetic Alloy" in Proceedings of The 3rd Sensor Symposium, 1983, pp. 219–222, which is incorporated herein by reference. The coil 24 is connected to the circuit 26 through lead wires 27. Reference numeral 28 indicates an O-ring seal, and reference numeral 29 indicates lead wires for signal, earth and power supply.

In operation, when the oil 22 from an inlet 30 is pressurized, the diaphragm 21 is deformed toward the groove 25 whereupon internal stress is produced in the diaphragm. This leads to a decrease in permeability of the alloy due to the magnetostrictive effect. As a result, the magnetic flux of the magnetic circuit decreases as a whole. This variation of the magnetic flux is detected by the detector circuit 26, through which the oil pressure is converted into an output voltage.

Figure 7:
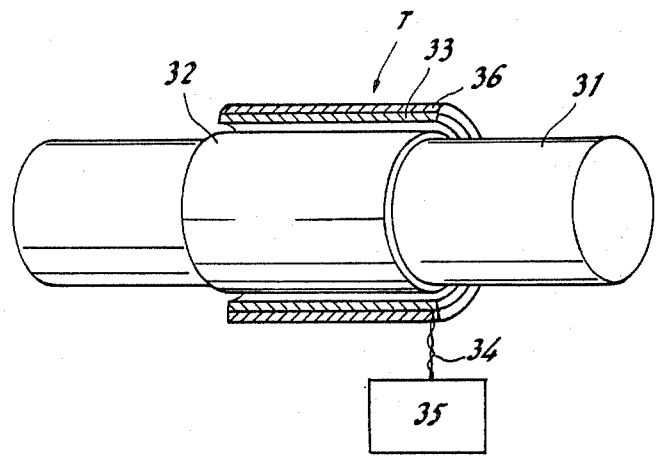
FIG. 7 is an illustrative view , partially in section, showing the principle of a torque sensor according to the invention.

FIG. 7 schematically shows a torque sensor, generally indicated by T, which includes a torque transmission shaft 31 and an amorphous alloy ribbon 32, in the form of a cylinder, which is directly wound around and fixed to the shaft 31 through an adhesive such as an epoxy resin. A coil 33 is concentrically wound in spaced relation with the ribbon 32, and has lead wires 34 through which a detector circuit 35 is connected. This circuit is similar to the circuit 26 of the oil pressure sensor described before. If necessary, a ferromagnetic cylinder 36 may be provided on or in spaced relation with the coil 33, by which magnetic flux generated from the coil 36 increases to an extent of greater than 4 times the coil alone.

In operation, when torque is applied to the torque transmission shaft 31, the shaft 31 is distorted and internal stress is produced in the amorphous alloy ribbon 32 according to the applied torque. At the same time, the coil is energized by the circuit 35, whereupon magnetic flux generates along the shaft 31. The distortion of the shaft 31 is transmitted to the ribbon, and permeability of the ribbon varies as in the case of the oil pressure sensor. This variation is detected as a variation of magnetic flux similar to the oil pressure sensor.

Figures 8A, 8B:
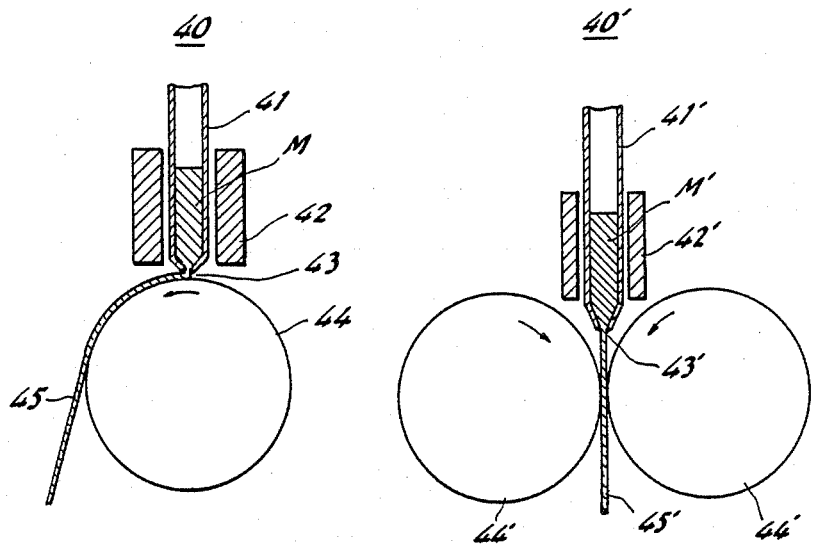
FIGS. 8(a) and (b) are illustrative views of rapid quenching methods to make alloy ribbons.
Figure 9:
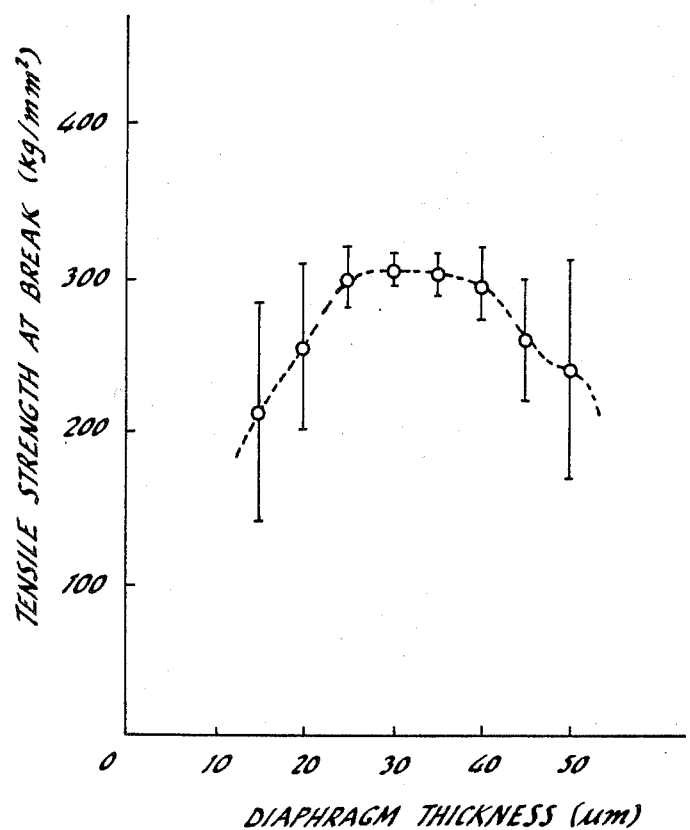
FIG. 9 a graph showing the relation between tensile strength at break of an amorphous magnetic alloy ribbon of $Fe_{75}Cr_4Si_{12.5}B_{8.5}$ and thickness of the ribbon.

The ribbon of the alloy used in the present invention is obtained according to a rapid quenching method. In the method, a molten alloy is brought into contact with a moving cold roll surface and solidified to obtain a ribbon. This procedure is schematically shown in FIGS. 8(a) and 8(b), which depict a single roll apparatus 40 and a twin-roll apparatus 40', respectively. In the figures, a metal M or M' in a quartz nozzle 41 or 41' is heated and melted by means of an electric furnace 42 or 42' and is passed through a nozzle 43 or 43' on a metallic roll 44 or rolls 44' to obtain an amorphous alloy sheet 45 or 45'. Properties of the sheet do not substantially change depending on the apparatus. However, if the sheet is formed in a thickness smaller than 25 μm, it may involve locally thinner portions due to the irregularity of the sheet, resulting in a considerable lowering of mechanical strength at the local portions. If high pressure is applied to the portions, the sheet is broken at the portions and is thus not suitable as a sensor material. On the other hand, when the sheet has a thickness over 40 μm, fine crystals are produced in the alloy, by which strength lowers. In FIG. 9, there is shown a tensile strength at break of $Fe_{75}Cr_4Si_{12.5}B_{8.5}$ amorphous alloy sheet in relation to the thickness of the alloy sheet. From the figure, it will be seen that when the sheet thickness is in the range of from 25 to 40 μm, the tensile strength at break is maintained high. Thus, the amorphous alloys are particularly suitable as materials for oil pressure or torque sensors.

The present invention is particularly described by way of examples.

EXAMPLE 1

Iron, chromium, silicon, and boron, each having a purity of not lower than 99.9%, were exactly weighed so that the resulting mixture had a composition by atomic percent of $Fe_{75}Cr_4Si_{12.5}B_{8.5}$. The mixture was molten by high frequency heating in an atmosphere of argon to obtain a matrix alloy. The alloy was placed in a rapid quenching apparatus 40 as shown in FIG. 8(a). The alloy in the quartz nozzle 41 was heated and melted by means of the electric furnace 42 at a temperature of 1330° C. The resulting melt was passed, under a pressure of argon of 0.2 Kg/cm², through the nozzle port 43 onto the copper roll 44 which was rotated at 1500 revolutions per minute and which had a diameter of 30 cm. Immediately, the melt was rapidly cooled and solidified on the roll surface. As a result, there was obtained a thin sheet of $Fe_{75}Cr_4Si_{12.5}B_{8.5}$ alloy havig a width of 40 mm and a thickness of 30 μm. The X-ray diffraction analysis revealed that the alloy sheet was amorphous in nature. The alloy sheet was subjected to a salt spraying test, using an aqueous 3% NaCl solution, at a temperature of 35° C. for 2 hours, but no oxidation was visually recognized on the surface. The alloy sheet was found to have a tensile strength at break as high as 300 Kg/mm² and a saturation magnetostriction of $25 \times 10^{-6}$.

When the alloy was annealed at 400° C. for 20 minutes under vacuum, its effective permeability (1 mOe, 1 KHz) was 8000 and thus the alloy exhibited a good soft magnetization characteristic. The alloy had a crystallization temperature of 465° C. and a Curie temperature of 319° C.

Figure 10:
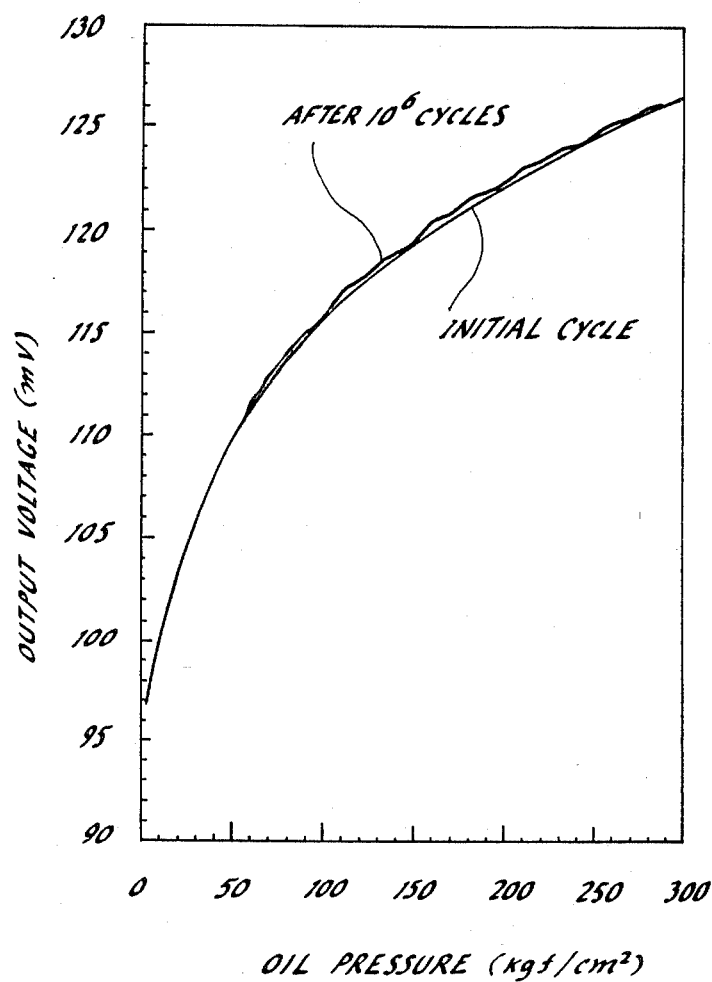
FIG. 10 is a graph showing the relation between output voltage and oil pressure at an initial pressure cycle and after $10^6$ cycles of pressure-applying and releasing operation.

The alloy sheet was used to make an oil pressure sensor having the construction shown in FIG. 5 and installed in the sensor system shown in FIG. 6. This system was used to determine the relation between oil pressure and output voltage. The results are shown in FIG. 10, revealing that when the oil pressure-output voltage curve after repeating $10^6$ cycles, each cycle comprising applying at 30° C. a pressure from 0 to 300 kgf/cm² to the sensor and releasing the pressure, was almost the same as the initial curve. If the detector circuit 26 is provided with an appropriate temperature correction circuit, the oil pressure-output voltage characteristic may be maintained almost constant in a tempeature range of from −30° C. to +120° C.

EXAMPLE 2

The general procedure of Example 1 was repeated using the twin-roll apparatus shown in FIG. 3(b) and a different alloy composition, thereby obtaining an amorphous alloy ribbon of $Fe_{73}Cr_6Si_{12}B_9$, and using copper rolls 14' having a diameter of 20 cm and a surface speed of 15 m/second. The ribbon had a width of 10 mm and a thickness of 37 μm. The tensile strength at break of this ribbon was 310 Kg/mm². The alloy was more resistant to corrosion than the alloy of Example 1, and had a saturation magnetostriction of $18 \times 10^{-6}$ with high permeability.

The ribbon was used to make an oil pressure sensor as in Example 1, with the result that the sensor had better performance than the sensor of Example 1.

EXAMPLE 3

The general procedure of Example 1 was repeated except that an amorphous alloy ribbon, which was made of $Fe_{79}Cr_3Si_{11}B_7$ alloy and had a width of 20 mm and a thickness of 35 μm, was made using an iron roll rotated at 2000 r.p.m. The ribbon had a tensile strength at break of 250 Kg/mm² and a saturation magnetostriction of $27 \times 10^{-6}$. The alloy had also high permeability and high corrosion resistance. This alloy ribbon was used to make a torque sensor as shown in FIG. 7.

This sensor was installed in a transmission of an automobile to control the travel performance of the automobile in a condition full of oil. The sensor was continuously used over 1000 hours and then withdrawn from the transmission, but no deterioration of the sensor was recognized because of the high corrosion resistance and high mechanical strength of the alloy.

As will be appreciated from the foregoing, the alloys used in the invention comprise not greater than 10 atomic percent of boron which is 10 to 100 times as expensive as the other constituent elements. The alloy cost is reduced to about ⅔ to ⅓ time the cost of similar amorphous alloys, contributing to low manufacture costs of stress-sensitive magnetic alloys sensors. The alloys have very good corrosion resistance, high mechanical strength, and great magnetostrictive effects, so that they are optimumly applied as oil pressure and torque sensors. Especially, the oil pressure sensor of the invention enables one to measure a pressure as high as about 300 Kgf/cm² in high accuracy without suffering any substantial timewise changes. Thus, the oil pressure sensor will have wide utility in the field of oil pressure control in automobiles and sensors of various machinery oil systems.

The torque sensors of the invention are also advantageous in that they can be used in or near the transmission of automobiles in a condition full of oil as will not be expected in prior art torque sensors. Because of the high strength of the alloy, the sensor is durable and can be used as a practical sensor.

As a matter of course, the alloys used in the invention may be applied not only as oil pressure and torque sensors, but also as other types of stress-sensitive sensors which require, particularly, high corrosion resistance, high mechanical strength, good magnetostrictive effects, and the like characteristics.

What is claimed is:

1. An oil pressure sensor, comprising
a ferromagnetic core and a coil mounted thereon for generating a magnetic flux;
a diaphragm of an amorphous magnetic alloy having high corrosion resistance, tensile strength and saturation magnetostriction which is positioned in said flux to form a magnetic circuit with said core, wherein said diaphragm is capable of being physically deformed in response to a change in oil pressure to be measured which is exerted on one side thereof while causing a variation of said flux in said circuit, and said alloy consists essentially of $Fe_aCr_bSi_cB_d$, wherein a is 69 to 79 atomic %, b is 4 to 6 atomic %, c is 10 to 15 atomic %, d is 6 to 10 atomic % and a+b+c+d=about 100 atomic % and said alloy has a tensile strength of $\geq 300$ Kg/mm²; and
means for detecting the variation of said flux; said sensor having high corrosion resistance tensile strength and saturation magnetostriction.

2. The oil pressure sensor of claim 1, wherein said core has a groove wherein said coil is received.

3. The oil pressure sensor of claim 1, wherein said diaphragm has a thickness of 25 to 40 microns.

4. the oil sensor of claim 1, wherein in said amorphous alloy
a is about 75 atomic %,
b is about 4 atomic %,
c is about 12.5 atomic %, and
d is about 8.5 atomic %.

5. The oil sensor of claim 1, wherein in said amorphous magnetic alloy
a is 69 to 73 atomic %,
b is about 6 atomic %,
c is 12 to 15 atomic %, and
d is about 9 to 10 atomic %.

6. The oil pressure sensor of claim 5, wherein in said amorphous magnetic alloy
a is about 73 atomic %,
c is about 12 atomic %, and
d is about 9 atomic %.

7. A torque sensor, comprising
means for generating a magnetic flux comprising a cylindrical coil;
a thin sheet of an amorphus magnetic alloy having high corrosion resistance, tensile strength and saturation magnetostriction which is positioned in said flux in spaced and concentric relation with said means and fixedly wound about a torque-transmitting member, wherein said sheet is capable of being physically deformable upon application of a torque by said member while causing a variation of said flux, and said alloy consists essentially of $Fe_a Cr_b Si_c B_d$, wherein a is 69 to 79 atomic %, b is 4 to 6 atomic %, c is 10 to 15 atomic %, d is 6 to 10 atomic %, and a+b+c+d=about 100 atomic % and has a tensile strength $\geq 300$ Kg/mm²; and
means for detecting the variation of said flux; said torque sensor having high corrosion resistance, tensile strength and saturation magnetostriction characteristics.

8. The torque sensor of claim 7, wherein
said thin sheet has a thickness of 25 to 40 microns.

9. The torque sensor of claim 7, wherein in said amorphous magnetic alloy
a is about 75 atomic %,
b is about 4 atomic %,
c is about 12.5 atomic %, and
d is about 8.5 atomic %.

10. The torque sensor of claim 7, wherein in said amorphous magnetic alloy
a is 69 to 73 atomic %,
b is about 6 atomic %,
c is 12 to 15 atomic %, and
b is 9 to 10 atomic %.

11. The torque sensor of claim 16, wherein in said amorphous magnetic alloy
- a is about 73 atomic %,
- c is about 12 atomic %, and
- d is about 9 atomic %.

12. The torque sensor of claim 7, further comprising a ferromagnetic cylinder arranged to surround said coil.

13. A stress-sensitive sensor, comprising
means for generating a magnetic flux;
a thin sheet of an amorphous magnetic alloy of high corrosion resistance, tensile strength and saturation magnetostriction which is positioned in said flux, wherein said sheet is capable of being physically deformed in response to an external force to be measured while inducing a variation in said flux, and said alloy consists essentially of $Fe_aCr_bSi_cB_d$, wherein a is 69 to 79 atomic %, b is 4 to 6 atomic %, c is 10 to 15 atomic %, d is 6 to 10 atomic %, and a+b+c+d=about 100 atomic % and has a tensile strength of $>300$ Kg/mm$^2$; and
means for detecting the variation of said flux; wherein said stress-sensitive sensor has high corrosion resistance, tensile strength and saturation magnetostriction characteristics for use under high stress, oil or oil mist conditions.

14. the stress-sensitive sensor of claim 13, wherein in said amorphous magnetic alloy
- a is about 75 atomic %,
- b is about 4 atomic %,
- c is about 12.5 atomic %, and
- d is about 8.5 atomic %.

15. The stress-sensitive sensor of claim 13, wherein in said amorphous magnetic alloy
- a is 69 to 73 atomic %,
- b is about 6 atomic %,
- c is 12 to 15 atomic %, and
- d is 9 to 10 atomic %.

16. The stress-sensitive sensor claim 15, wherein in said amorphous magnetic alloy
- a is about 73 atomic %,
- c is about 12 atomic %, and
- d is about 9 atomic %.

* * * * *